US012772774B2

(12) United States Patent
Okajima et al.

(10) Patent No.: US 12,772,774 B2
(45) Date of Patent: Oct. 20, 2026

(54) SUBSTRATE PROCESSING APPARATUS, INNER TUBE AND METHOD OF MANUFACTURING SEMICONDUCTOR DEVICE

(71) Applicant: Kokusai Electric Corporation, Tokyo (JP)

(72) Inventors: Yusaku Okajima, Toyama (JP); Takatomo Yamaguchi, Toyama (JP); Yunosuke Sakai, Toyama (JP); Yoshinori Imai, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 896 days.

(21) Appl. No.: 17/939,578

(22) Filed: Sep. 7, 2022

(65) Prior Publication Data

US 2023/0005760 A1 Jan. 5, 2023

Related U.S. Application Data

(63) Continuation of application No. PCT/JP2020/012890, filed on Mar. 24, 2020.

(51) Int. Cl.
*H10P 72/00* (2026.01)
*C23C 16/34* (2006.01)
(Continued)

(52) U.S. Cl.
CPC ........ *H10P 72/0402* (2026.01); *C23C 16/345* (2013.01); *C23C 16/4412* (2013.01);
(Continued)

(58) Field of Classification Search
None
See application file for complete search history.

(56) References Cited

U.S. PATENT DOCUMENTS 4,638,762 A * 1/1987 Kim ........................ C30B 25/12 118/725
6,390,786 B1 5/2002 Gennami et al.
(Continued)

FOREIGN PATENT DOCUMENTS

JP 5534979 B2 * 7/2014 ....... C23C 16/45578
JP 2018-088520 6/2018
(Continued)

OTHER PUBLICATIONS

First Office Action with English translation in Chinese Application No. 202080096625.6, issued Mar. 1, 2025, 22 pages.

*Primary Examiner* — Karla A Moore
(74) *Attorney, Agent, or Firm* — Edell, Shapiro & Finnan, LLC

(57) ABSTRACT

According to one aspect of a technique the present disclosure, there is provided a processing apparatus including: an inner tube provided with a substrate accommodating region in which substrates are accommodated along an arrangement direction; an outer tube provided outside the inner tube; gas supply ports provided on a side wall of the inner tube along the arrangement direction; first exhaust ports provided on the side wall of the inner tube along the arrangement direction; a second exhaust port provided at a lower end portion of the outer tube; and a gas guide for controlling a flow of gas in an annular space between the inner tube and the outer tube and including a first fin near a lowermost first exhaust port among the first exhaust ports that is closest to the second exhaust port in a space between the lowermost first exhaust port and the second exhaust port.

13 Claims, 6 Drawing Sheets

(51) Int. Cl.
*C23C 16/44* (2006.01)
*C23C 16/455* (2006.01)
*C23C 16/458* (2006.01)
*H10P 72/10* (2026.01)

(52) U.S. Cl.
CPC .... *C23C 16/45591* (2013.01); *C23C 16/4583* (2013.01); *H10P 72/12* (2026.01); *H10P 72/14* (2026.01)

(56) References Cited

U.S. PATENT DOCUMENTS

| | | | | |
|---|---|---|---|---|
| 2009/0305512 | A1* | 12/2009 | Matsuura | C23C 16/45591 118/724 |
| 2012/0186573 | A1* | 7/2012 | Jdira | H01L 21/67109 126/58 |
| 2020/0048768 | A1* | 2/2020 | Wiegers | C23C 16/45591 |

FOREIGN PATENT DOCUMENTS

| | | |
|---|---|---|
| JP | 2019-165210 | 9/2019 |
| JP | 2020-027941 | 2/2020 |

* cited by examiner

SUBSTRATE PROCESSING APPARATUS, INNER TUBE AND METHOD OF MANUFACTURING SEMICONDUCTOR DEVICE

CROSS REFERENCE TO RELATED APPLICATIONS

This application is a continuation application of PCT International Application No. PCT/JP2020/012890, filed on Mar. 24, 2020, the entire contents of which are hereby incorporated by reference.

TECHNICAL FIELD

The present disclosure relates to a substrate processing apparatus, an inner tube and a method of manufacturing a semiconductor device.

BACKGROUND

According to some related arts, as a part of a manufacturing process of a semiconductor device, a step of processing a plurality of substrates accommodated in a process chamber may be performed by supplying a gas to the process chamber.

SUMMARY

According to the present disclosure, there is provided a technique capable of improving a processing uniformity between a plurality of substrates when processing the plurality of substrates.

According to one or more embodiments of the present disclosure, there is provided a technique related to a substrate processing apparatus including: an inner tube provided with a substrate accommodating region in which a plurality of substrates are accommodated in a multistage manner along a predetermined arrangement direction while the plurality of substrates are horizontally oriented; an outer tube provided outside the inner tube; a plurality of gas supply ports provided on a side wall of the inner tube along the predetermined arrangement direction; a plurality of first exhaust ports provided on the side wall of the inner tube along the predetermined arrangement direction; a second exhaust port provided at a lower end portion of the outer tube; and a gas guide configured to be capable of controlling a flow of a gas in an annular space between the inner tube and the outer tube, wherein the gas guide comprises a first fin in vicinity of a lowermost first exhaust port among the plurality of first exhaust ports that is closest to the second exhaust port in a space between the lowermost first exhaust port and the second exhaust port.

BRIEF DESCRIPTION OF THE DRAWINGS

FIG. 5A is a diagram schematically illustrating an outer wall of an inner tube 21 when viewed from a direction C shown in FIG. 4, FIG. 5B is a diagram schematically illustrating the outer wall of the inner tube 21 when viewed from a direction D shown in FIG. 4 and FIG. 5C is a diagram schematically illustrating the outer wall of the inner tube 21 when viewed from a direction E shown in FIG. 4.

DETAILED DESCRIPTION

Embodiments of Present Disclosure

Hereinafter, one or more embodiments (also simply referred to as "embodiments") according to the technique of the present disclosure will be described with reference to FIGS. 1 through 4 and FIGS. 5A through 5C.

(1) Configuration of Substrate Processing Apparatus

A substrate processing apparatus according to the present embodiments is used in a manufacturing process of a semiconductor device, and is configured as a vertical type substrate processing apparatus capable of collectively processing a plurality of substrates (for example, 5 substrates to 100 substrates) including a substrate to be processed. For example, the substrate to be processed may include a semiconductor wafer substrate (hereinafter, simply referred to as a "wafer") on which a semiconductor integrated circuit device (that is, the semiconductor device) is manufactured.

Figure 1:
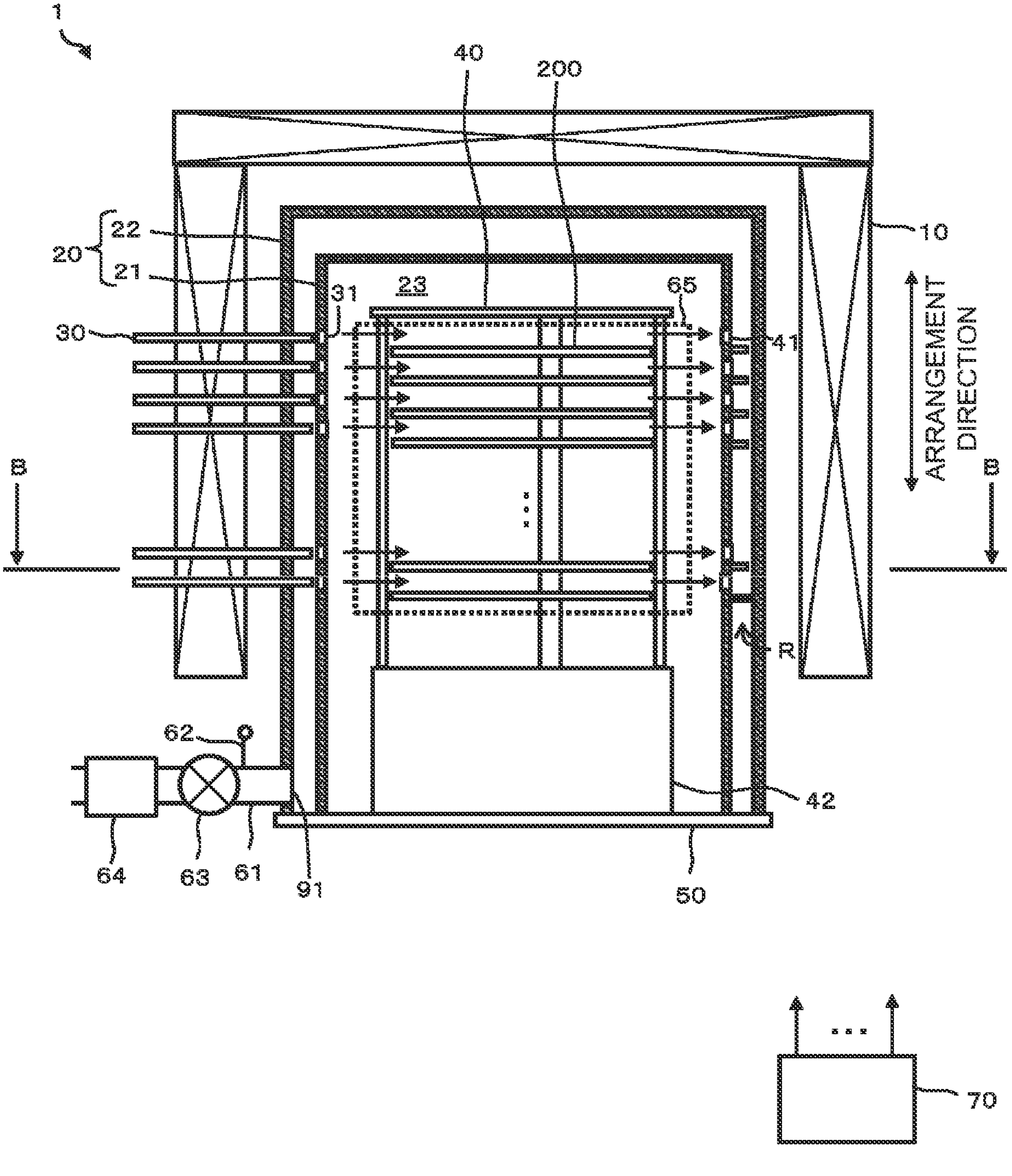
FIG. 1 is a diagram schematically illustrating a vertical cross-section of a vertical type process furnace of a substrate processing apparatus preferably used in one or more embodiments of the present disclosure.

As shown in FIG. 1, the substrate processing apparatus according to the present embodiments includes a vertical type process furnace 1. The vertical type process furnace 1 includes a heater 10 serving as a heating apparatus (which is a heating structure or a heating system). The heater 10 is of a cylindrical shape, and is installed perpendicular to an installation floor (not shown) of the substrate processing apparatus while being supported by a heater base (not shown) serving as a support plate. The heater 10 also functions as an activator (also referred to as an "exciter") capable of activating (or exciting) a gas by heat.

A reaction tube 20 constituting a reaction vessel (which is a process vessel) is provided in an inner side of the heater 10 to be aligned in a manner concentric with the heater 10. For example, the reaction tube 20 is embodied by a double tube configuration including an inner tube 21 serving as an inner reaction tube and an outer tube 22 serving as an outer reaction tube and provided to surround the inner tube 21 to be aligned in a manner concentric with the inner tube 21. For example, each of the inner tube 21 and the outer tube 22 is made of a heat resistant material such as quartz (SiO2) and silicon carbide (SiC). For example, each of the inner tube 21 and the outer tube 22 is of a cylindrical shape with a closed upper end and an open lower end.

A process chamber 23 in which a plurality of wafers including a wafer 200 are processed is provided in the inner tube 21. Hereinafter, the plurality of wafers including the wafer 200 may also be simply referred to as wafers 200. The process chamber 23 is configured such that the wafers 200 are capable of being accommodated in a boat 40 described later in the process chamber 23 in a multistage manner in a predetermined arrangement direction (for example, a vertical direction according to the present embodiments) while the wafers 200 are horizontally oriented in the boat 40. In the present specification, a direction in which the wafers 200 are arranged in the process chamber 23 may also be referred to as an "arrangement direction". Further, a region in the process chamber 23 in which the wafers 200 are accommodated along the arrangement direction while the wafers 200 are horizontally oriented may also be referred to as a "substrate accommodating region 65".

A seal cap 50 serving as a furnace opening lid capable of airtightly sealing (or closing) a lower end opening of the reaction tube 20 is provided under the reaction tube 20. For example, the seal cap 50 is made of a metal material such as stainless steel (SUS), and is of a disk shape. An O-ring (not shown) serving as a seal is provided on an upper surface of the seal cap 50 so as to be in contact with a lower end of the reaction tube 20. The seal cap 50 is configured to be elevated or lowered in the vertical direction by a boat elevator (not shown) serving as an elevator. The boat elevator serves as a transfer system (which is a transfer structure) that transfers (or loads) the boat 40 and the wafers 200 accommodated in the boat 40 into the process chamber 23 or transfers (or unloads) the boat 40 and the wafers 200 accommodated in the boat 40 out of the process chamber 23 by elevating or lowering the seal cap 50.

A substrate loading/unloading port (not shown) is provided below the seal cap 50. The wafer 200 is transferred into or out of a transfer chamber (not shown) by a transfer robot (not shown) through the substrate loading/unloading port. In the transfer chamber, the wafer 200 may be transferred (loaded) into the boat 40, and the wafer 200 may be transferred (unloaded) out of the boat 40.

The boat 40 serving as a substrate support (or a substrate retainer) is configured such that the wafers 200 (for example, 5 wafers to 100 wafers) are accommodated (or supported) in the boat 40 in the predetermined arrangement direction (for example, the vertical direction according to the present embodiments) while the wafers 200 are horizontally oriented with their centers aligned with one another with a predetermined gap therebetween in the multistage manner. For example, the boat 40 is made of a heat resistant material such as quartz and SiC. A heat insulator 42 is provided below the boat 40. For example, a heat insulating cylinder made of a heat resistant material such as quartz and SiC may be used as the heat insulator 42. Alternatively, for example, a plurality of heat insulating plates made of a heat resistant material such as quartz and SiC and horizontally oriented in a multistage manner may be used as the heat insulator 42.

In the reaction tube 20, a plurality of nozzles including a nozzle 30 serving as a gas supplier (which is a gas supply structure) through which the gas such as a source gas and a reactive gas is supplied toward the inner tube 21 are provided so as to be arranged in the predetermined arrangement direction (for example, the vertical direction according to the present embodiments) and so as to penetrate the heater 10 and the outer tube 22 through side walls of the heater 10 and the outer tube 22. Hereinafter, the plurality of nozzles including the nozzle 30 may also be simply referred to as nozzles 30. Further, the nozzles 30 are provided corresponding to the wafers 200 accommodated in the substrate accommodating region 65, respectively. Further, the nozzles 30 are provided such that the gas is capable of being ejected toward surfaces of the wafers 200 accommodated in the substrate accommodating region 65 through the nozzles 30 in a direction substantially parallel to the surfaces of the wafers 200.

Figure 5C:
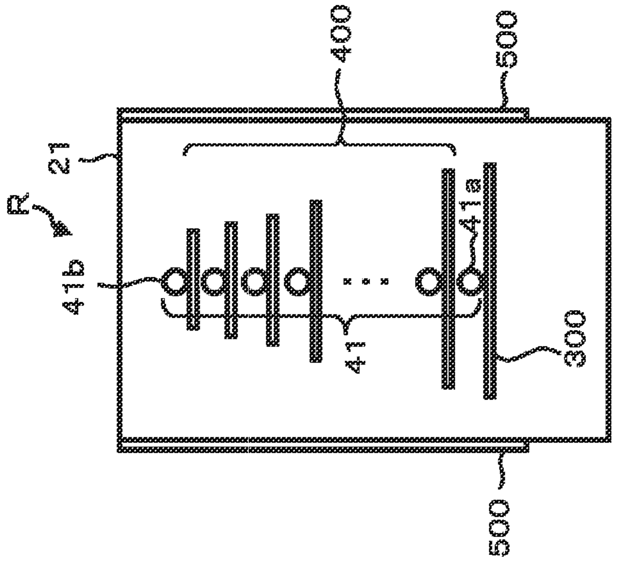
FIGS. 5A through 5C are diagrams schematically illustrating an exemplary configuration of the substrate processing apparatus preferably used in the embodiments of the present disclosure, and more specifically.
Figure 5B:
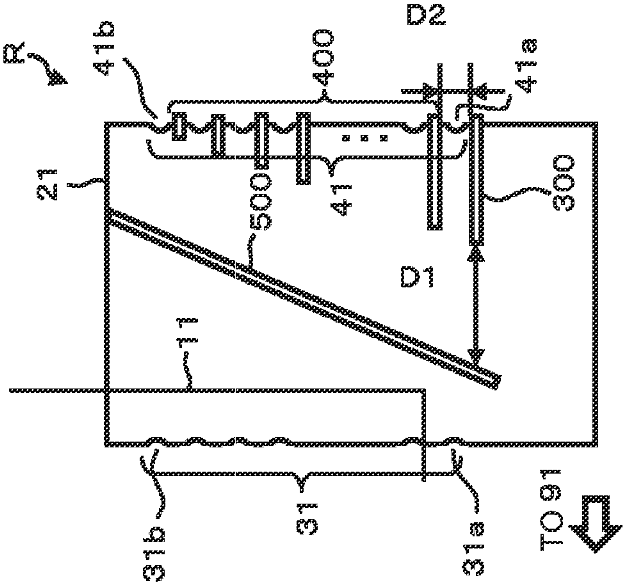
Figure 5A:
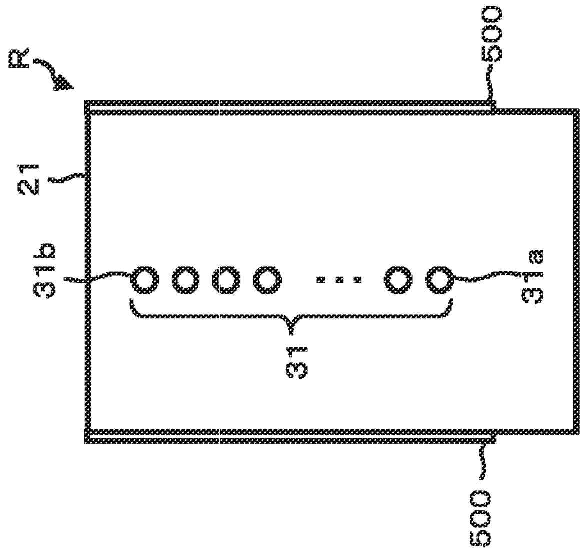

As shown in FIG. 5A, a plurality of gas supply ports including a gas supply port 31 through which the gas supplied through the nozzles 30 is introduced into the inner tube 21 are provided on a side wall of the inner tube 21 so as to be arranged in the predetermined arrangement direction (for example, the vertical direction according to the present embodiments). Hereinafter, the plurality of gas supply ports including the gas supply port 31 may also be simply referred to as gas supply ports 31. Further, the gas supply ports 31 are provided corresponding to the wafers 200 accommodated in the substrate accommodating region 65, respectively. Further, the gas supply ports 31 are provided at positions facing front ends (tips) of the nozzles 30, respectively. In the present specification, among the gas supply ports 31, a gas supply port provided at a lowermost location and facing a first exhaust port 41*a* described later may also be referred to as a "gas supply port 31*a*". Further, among the gas supply ports 31, a gas supply port (or gas supply ports) (for example, a gas supply port provided at an uppermost location) different from the gas supply port 31*a* and facing a first exhaust port (or first exhaust ports) 41*b* described later may also be referred to as a "gas supply port (or the gas supply ports) 31*b*".

Figure 2:
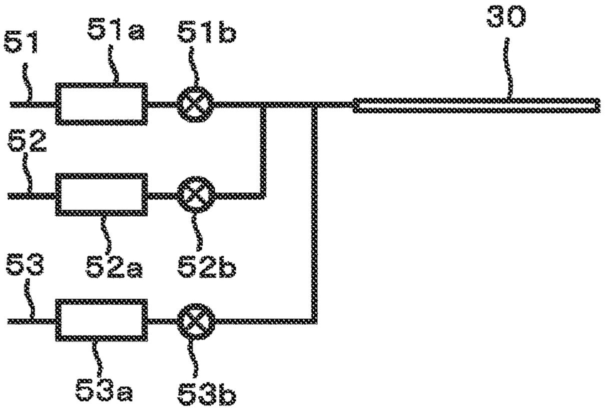
FIG. 2 is a diagram schematically illustrating a gas supply structure of the vertical type process furnace of the substrate processing apparatus preferably used in the embodiments of the present disclosure.

As shown in FIG. 2, a gas supply pipe 51 is connected to each of the nozzles 30. A mass flow controller (MFC) 51*a* serving as a flow rate controller (flow rate controlling structure) and a valve 51*b* serving as an opening/closing valve are sequentially provided at the gas supply pipe 51 in this order from an upstream side to a downstream side of the gas supply pipe 51 along a gas flow direction. Gas supply pipes 52 and 53 are connected to the gas supply pipe 51 at a downstream side of the valve 51*b*. Mass flow controllers (also simply referred to as "MFCs") 52*a* and 53*a* and valves 52*b* and 53*b* are sequentially provided at the gas supply pipes 52 and 53, respectively, in this order from upstream sides to downstream sides of the gas supply pipes 52 and 53 in the gas flow direction.

For example, as the source gas, a silane-based gas containing silicon (Si) serving as a main element constituting a film to be formed on the wafer 200 is supplied into the process chamber 23 through the gas supply pipe 51 provided with the MFC 51*a* and the valve 51*b* and the nozzle 30. For example, as the silane-based gas, hexachlorodisilane (Si2Cl6, abbreviated as HCDS) gas may be used.

For example, as the reactive gas, a nitriding gas is supplied into the process chamber 23 through the gas supply pipe 52 provided with the MFC 52*a* and the valve 52*b*, the gas supply pipe 51 and the nozzle 30. For example, as the nitriding gas, ammonia (NH3) gas may be used.

For example, as an inert gas, a nitrogen (N2) gas is supplied into the process chamber 23 through the gas supply pipe 53 provided with the MFC 53*a* and the valve 53*b*, the gas supply pipe 51 and the nozzle 30. For example, N2 gas serves as a purge gas, a dilution gas or a carrier gas.

Figure 4:
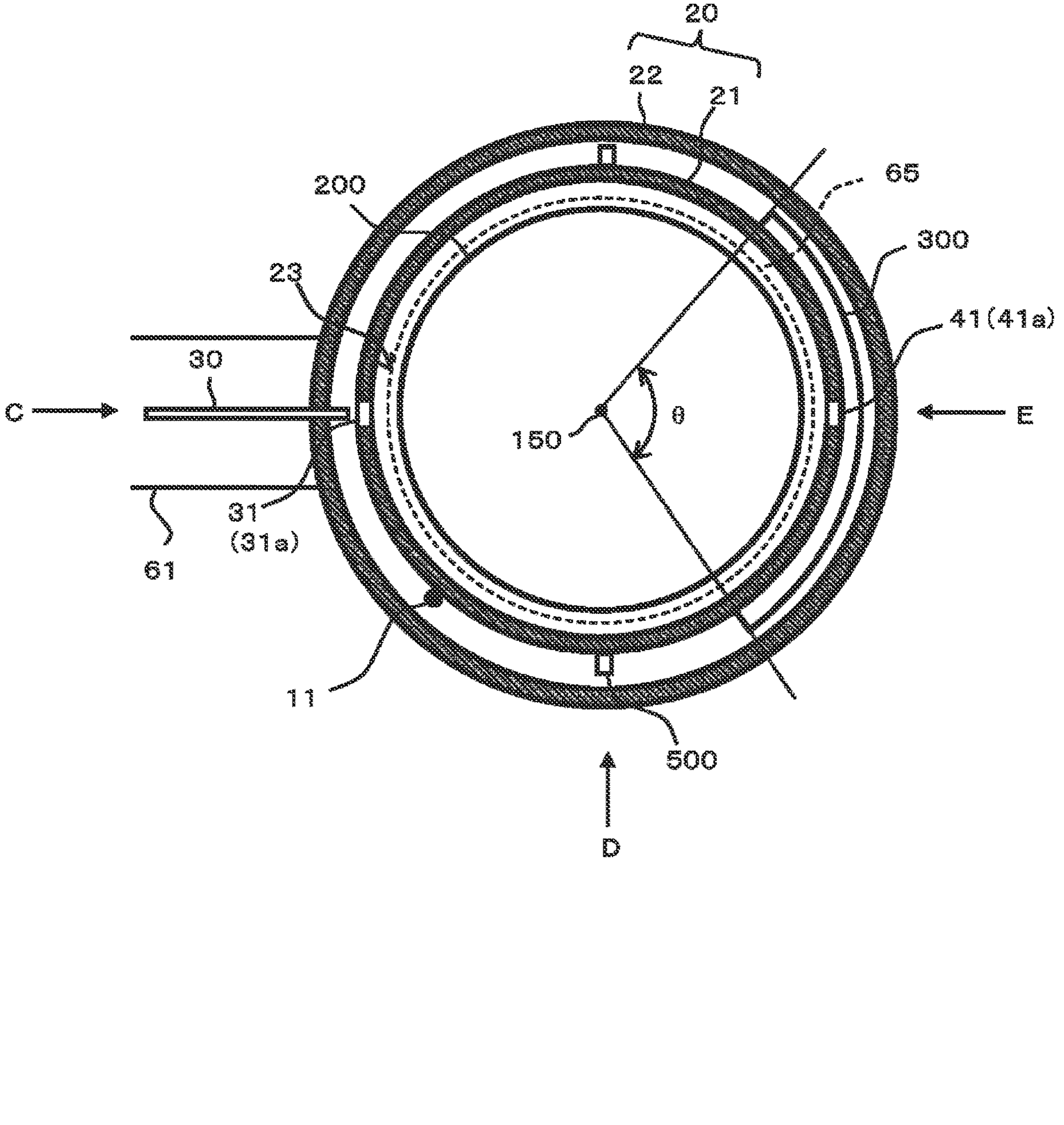
FIG. 4 is a diagram schematically illustrating a horizontal cross-section taken along a line B-B, shown in FIG. 1, of the vertical type process furnace of the substrate processing apparatus preferably used in the embodiments of the present disclosure.

As shown in FIG. 4, a plurality of first exhaust ports including a first exhaust port 41 are provided on the side wall of the inner tube 21 at positions facing the gas supply ports 31 via the substrate accommodating region 65. Hereinafter, the plurality of first exhaust ports including a first exhaust port 41 may also be simply referred to as first exhaust ports 41. As shown in FIGS. 1 and 5C, the first exhaust ports 41 are provided so as to be arranged in the predetermined arrangement direction (for example, the vertical direction according to the present embodiments). The first exhaust ports 41 are configured such that the gas supplied through the gas supply ports 31 into the inner tube 21 is discharged (or exhausted) out of the inner tube 21 through the first exhaust ports 41. Further, the first exhaust ports 41 are provided corresponding to the gas supply ports 31 (that is, the wafers 200 accommodated in the substrate accommodating region 65), respectively. In the present specification, among the first exhaust ports 41, a first exhaust port provided closest to a second exhaust port 91 described later (that is, a first exhaust port provided at a lowermost location may also be referred to as an "exhaust port A" (that is, the first exhaust port 41*a* described above). Further, for example, among the first exhaust ports 41, a first exhaust port other than the first exhaust port 41*a* and provided at an uppermost location or first exhaust ports other than the first exhaust port 41*a* and spaced apart from the second exhaust port 91 described later may also be referred to as an "exhaust port B" or "exhaust ports B" (that is, the first exhaust port or the first exhaust ports 41*b* described above). In the present specification, the exhaust port A may also be referred to as a "lowermost first exhaust port 41*a*", and the exhaust port B (or the exhaust ports B) may also be referred to as an upper first exhaust port 41*b* (or upper first exhaust ports 41*b*).

The second exhaust port 91 is provided at an end portion (for example, a lower end portion according to the present embodiments) of the outer tube 22 wherein the end portion is defined on the basis of the predetermined arrangement direction (for example, the vertical direction according to the present embodiments) such that the gas discharged from the inner tube 21 to the outer tube 22 through the first exhaust ports 41 (that is, an exhaust gas flowing in an annular space between the inner tube 21 and the outer tube 22) is discharged (or exhausted) out of the reaction tube 20 through the second exhaust port 91. An exhaust pipe 61 is connected to the second exhaust port 91. A vacuum pump 64 serving as a vacuum exhaust apparatus is connected to the exhaust pipe 61 through a pressure sensor 62 serving as a pressure detector (which is a pressure detecting structure) configured to detect an inner pressure of the reaction tube 20 and an APC (Automatic Pressure Controller) valve 63 serving as a pressure regulator (which is a pressure adjusting structure). With the vacuum pump 64 in operation, the APC valve 63 may be opened or closed to perform a vacuum exhaust of an inner atmosphere of the process chamber 23 or stop the vacuum exhaust. In addition, with the vacuum pump 64 in operation, an opening degree of the APC valve 63 may be adjusted in order to adjust the inner pressure of the process chamber 23 based on pressure information detected by the pressure sensor 62. An exhaust system (which is an exhaust structure or an exhaust line) is constituted mainly by the exhaust pipe 61, the APC valve 63 and the pressure sensor 62.

A gas guide R is provided between the inner tube 21 and the outer tube 22. The gas guide R is configured to be capable of controlling a flow of the gas in the annular space between the inner tube 21 and the outer tube 22 (hereinafter, also referred to as an "exhaust buffer space"), that is, a flow (also referred to as an "exhaust path") of the exhaust gas discharged into the exhaust buffer space through the first exhaust ports 41 and flowing toward the second exhaust port 91. A specific configuration of the gas guide R will be described later.

A temperature sensor 11 serving as a temperature detector is installed between the inner tube 21 and the outer tube 22. A state of electric conduction to the heater 10 may be adjusted based on temperature information detected by the temperature sensor 11 such that a desired temperature distribution of an inner temperature of the process chamber 23 can be obtained. As shown in FIG. 5B, for example, the temperature sensor 11 is L-shaped, and is provided along an outer wall of the inner tube 21.

Figure 3:
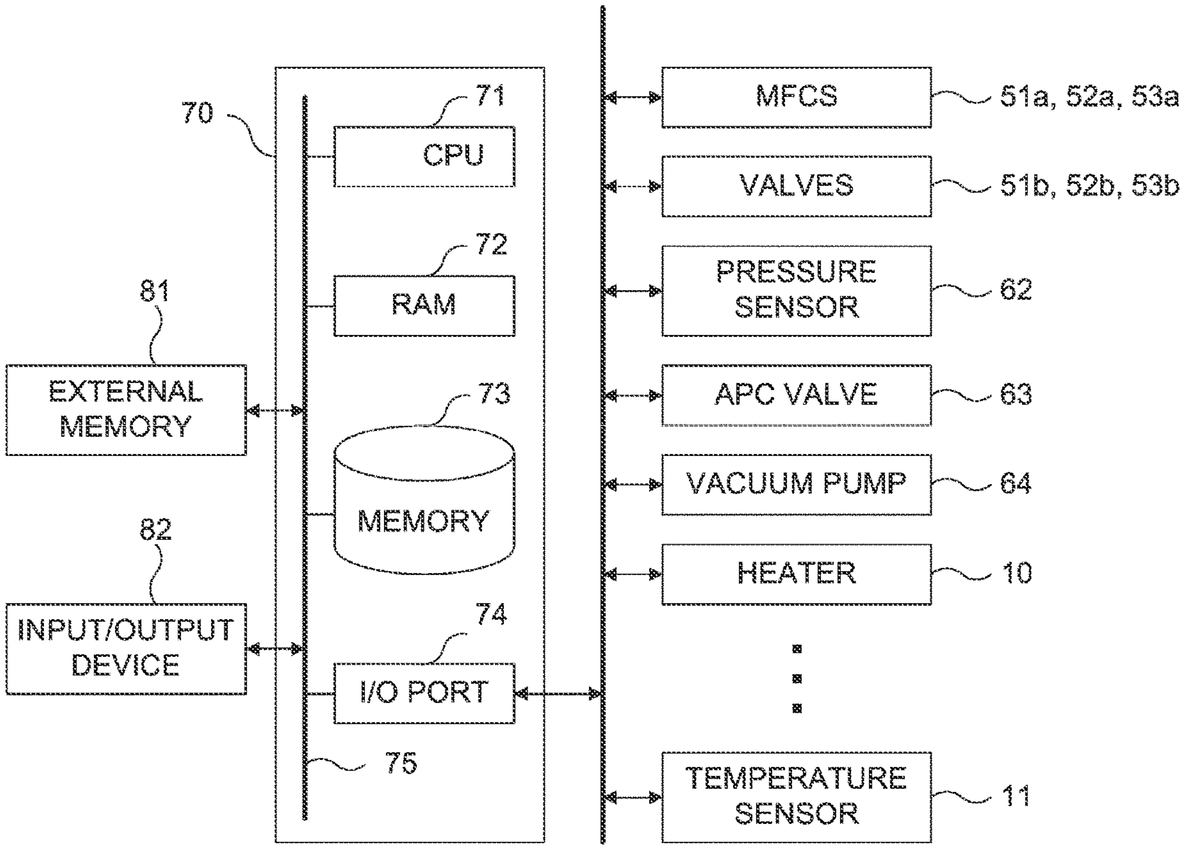
FIG. 3 is a block diagram schematically illustrating a configuration of a controller and related components of the substrate processing apparatus preferably used in the embodiments of the present disclosure.

As shown in FIG. 3, a controller 70 serving as a control device (control structure) is constituted by a computer including a CPU (Central Processing Unit) 71, a RAM (Random Access Memory) 72, a memory 73 and an input/output (I/O) port 74. The RAM 72, the memory 73 and the I/O port 74 may exchange data with the CPU 71 through an internal bus 75. For example, an external memory 81 and an input/output device 82 constituted by a component such as a touch panel are connected to the controller 70.

For example, the memory 73 is configured by a component such as a flash memory and a hard disk drive (HDD). For example, data such as a control program configured to control operations of the substrate processing apparatus and a process recipe containing information on sequences and conditions of a method of manufacturing a semiconductor device described later may be readably stored in the memory 73. The process recipe is obtained by combining steps (or processes) of the method of manufacturing the semiconductor device described later such that the controller 70 can execute the steps to acquire a predetermined result, and functions as a program. Hereinafter, the process recipe and the control program may be collectively or individually referred to as a "program". In addition, the process recipe may also be simply referred to as a "recipe". In the present specification, the term "program" may refer to the recipe alone, may refer to the control program alone, or may refer to both of the recipe and the control program. The RAM 72 functions as a memory area (work area) where the program or data read by the CPU 71 is temporarily stored.

The I/O port 74 is connected to the above-described components such as the MFCs 51*a*, 52*a* and 53*a*, the valves 51*b*, 52*b* and 53*b*, the pressure sensor 62, the APC valve 63, the vacuum pump 64, the heater 10 and the temperature sensor 11.

The CPU 71 is configured to read the control program from the memory 73 and execute the read control program. In addition, the CPU 71 is configured to read the recipe from the memory 73 in accordance with an operation command inputted from the input/output device 82. According to the contents of the read recipe, the CPU 71 may be configured to be capable of controlling various operations such as flow rate adjusting operations for various gases by the MFCs 51*a*, 52*a* and 53*a*, opening and closing operations of the valves 51*b*, 52*b* and 53*b*, an opening and closing operation of the APC valve 63, a pressure adjusting operation by the APC valve 63 based on the pressure sensor 62, a start and stop of the vacuum pump 64, a temperature adjusting operation by the heater 10 based on the temperature sensor 11 and an elevating and lowering operation of the boat 40 by the elevator (not shown).

The controller 70 may be embodied by installing the above-described program stored in the external memory 81 into the computer. For example, the external memory 81 may include a magnetic tape, a magnetic disk such as a hard disk drive (HDD), an optical disk such as a CD, a magneto-optical disk such as an MO and a semiconductor memory such as a USB memory. The memory 73 or the external memory 81 may be embodied by a non-transitory computer readable recording medium. Hereinafter, the memory 73 and the external memory 81 may be collectively or individually referred to as a "recording medium". In the present specification, the term "recording medium" may refer to the memory 73 alone, may refer to the external memory 81 alone, and may refer to both of the memory 73 and the external memory 81. Further, instead of using the external memory 81, a communication structure such as the Internet and a dedicated line may be used for providing the program to the computer.

(2) Substrate Processing

Hereinafter, as a part of the manufacturing process of the semiconductor device, an exemplary film-forming sequence of a substrate processing (also referred to as a "film-forming process") of forming a film on the wafer 200 serving as the substrate will be described. The substrate processing is performed by using the substrate processing apparatus described above. In the following description, operations of components constituting the substrate processing apparatus are controlled by the controller 70.

In the film-forming sequence according to the present embodiments, a silicon nitride film (also simply referred to as a "SiN film") is formed on the wafer 200 by performing a cycle a predetermined number of times (n times, n is an integer equal to or greater than 1), wherein the cycle includes a first step of supplying the HCDS gas serving as the source gas to the wafer 200 accommodated in the process vessel (the process chamber 23) and a second step of supplying the NH3 gas serving as the reactive gas to the wafer 200 accommodated in the process chamber 23, and the steps of the cycle are performed non-simultaneously (that is, the steps of the cycle are performed alternately without overlapping with each other).

In the present specification, the film-forming process described above may be represented, for simplicity's sake, as follows. Film-forming processes of other embodiments, which will be described later, will be also represented in the same manner.

$$(\mathrm{HCDS}\rightarrow\mathrm{NH3})\times n \Rightarrow \mathrm{SiN}$$

Wafer Charging Step and Boat Loading Step

After the wafers 200 are charged (transferred) into the boat 40 (wafer charging step), the boat 40 charged with the wafers 200 is elevated by the boat elevator (not shown) and loaded (transferred) into the process chamber 23 (boat loading step). With the boat 40 loaded into the process chamber 23, the seal cap 50 seals the lower end of the reaction tube 20 via the O-ring (not shown).

Pressure Adjusting Step and Temperature Adjusting Step

The vacuum pump 64 vacuum-exhausts (decompresses and exhausts) the process chamber 23 (that is, a space in which the wafers 200 are accommodated) such that the inner pressure of the process chamber 23 reaches and is maintained at a desired pressure (vacuum degree). When vacuum-exhausting the process chamber 23, the inner pressure of the reaction tube 20 is measured by the pressure sensor 62, and the APC valve 63 is feedback-controlled based on the pressure information measured by the pressure sensor 62 such that the inner pressure of the process chamber 23 is adjusted to the desired pressure (pressure adjusting step). The vacuum pump 64 continuously vacuum-exhausts the process chamber 23 until at least a processing of the wafer 200 is completed. In addition, the heater 10 heats the process chamber 23 such that a temperature of the wafer 200 accommodated in the process chamber 23 reaches and is maintained at a desired film-forming temperature. When heating the process chamber 23, the state of the electric conduction to the heater 10 is feedback-controlled based on the temperature information detected by the temperature sensor 11 such that the desired temperature distribution of the inner temperature of the process chamber 23 is obtained (temperature adjusting step). The heater 10 continuously heats the process chamber 23 until at least the processing of the wafer 200 is completed.

Film-Forming Step

Thereafter, as a film-forming step, the following two steps, that is, the first step and the second step are sequentially performed.

First Step

In the first step, the HCDS gas is supplied to each of the wafers 200 in the process chamber 23.

Specifically, the valve **51*b* is opened, and the HCDS gas is supplied into the gas supply pipe 51. After a flow rate of the HCDS gas is adjusted by the MFC 51*a*, the HCDS gas whose flow rate is adjusted is supplied into the process chamber 23 (that is, into the inner tube 21) through the nozzle 30 and the gas supply ports 31. The HCDS gas supplied into the inner tube 21 flows in a direction parallel to the surfaces of the wafers 200 (that is, a horizontal direction), is discharged out of the inner tube 21 through the first exhaust ports 41, and is exhausted through the second exhaust port 91 via the annular space (that is, the exhaust buffer space) between the inner tube 21 and the outer tube 22. Thereby, the HCDS gas is supplied to each of the wafers 200. When the HCDS gas is supplied to the wafers 200, the valve 53*b* is opened, and the N2 gas is supplied into the gas supply pipe 53. After a flow rate of the N2 gas is adjusted by the MFC 53*a*, the N2 gas whose flow rate is adjusted is supplied into the inner tube 21 through the nozzle 30 and the gas supply ports 31**. The N2 gas serves as the carrier gas.

In the first step, for example, the inner pressure of the process chamber 23 may be set to a pressure within a range from 0.1 Torr to 30 Torr, preferably from 0.2 Torr to 20 Torr, and more preferably from 0.3 Torr to 13 Torr. For example, a supply flow rate of the HCDS gas may be set to a flow rate within a range from 0.1 slm to 10 slm, preferably from 0.2 slm to 2 slm. For example, a supply flow rate of the N2 gas may be set to a flow rate within a range from 0.1 slm to 20 slm. For example, a supply time of the HCDS gas may be set to a time within a range from 0.1 second to 60 seconds, preferably from 0.5 second to 5 seconds. For example, a temperature of the heater 10 may be set such that the temperature of the wafer 200 reaches and is maintained at a temperature within a range from 200° C. to 900° C., preferably from 300° C. to 850° C., and more preferably from 400° C. to 750° C.

By supplying the HCDS to each of the wafers 200, a silicon-containing layer serving as a first layer is formed on an outermost surface of each of the wafers 200.

After the first layer is formed, the valve **51*b* is closed to stop a supply of the HCDS gas into the inner tube 21. When stopping the supply of the HCDS gas, with the APC valve 63 open, the vacuum pump 64 vacuum-exhausts the reaction tube 20 such that the HCDS gas remaining in the process chamber 23 which did not react or which contributed to the formation of the first layer is removed from the process chamber 23. When vacuum-exhausting the reaction tube 20, with the valve 53***b* open, the N2 gas is continuously supplied into the process chamber 23. The N2 gas serves as the purge gas, which improves an efficiency of removing the gas (such as the HCDS gas) remaining in the process chamber 23 out of the process chamber 23. After a purge process of purging the process chamber 23 by the N2 gas is completed, the valve 53*b* is closed to stop a supply of the N2 gas into the process chamber 23.

Second Step

After the first step is completed, in the second step, the NH3 gas is supplied to each of the wafers 200 in the process chamber 23.

Specifically, the valve 52*b* is opened, and the NH3 gas is supplied into the gas supply pipe 52. After a flow rate of the NH3 gas is adjusted by the MFC 52*a*, the NH3 gas whose flow rate is adjusted is supplied into the process chamber 23 (that is, into the inner tube 21) through the gas supply pipe 51, the nozzle 30 and the gas supply ports 31. The NH3 gas supplied into the inner tube 21 flows in the direction parallel to the surfaces of the wafers 200 (that is, the horizontal direction), is discharged out of the inner tube 21 through the first exhaust ports 41, and is exhausted through the second exhaust port 91 via the annular space (that is, the exhaust buffer space) between the inner tube 21 and the outer tube 22. Thereby, the NH3 gas is supplied to each of the wafers 200. When the NH3 gas is supplied to the wafers 200, the valve 53*b* is opened, and the N2 gas is supplied into the gas supply pipe 53. After the flow rate of the N2 gas is adjusted by the MFC 53*a*, the N2 gas whose flow rate is adjusted is supplied into the inner tube 21 through the nozzle 30 and the gas supply ports 31. The N2 gas serves as the carrier gas.

In the second step, for example, the inner pressure of the process chamber 23 may be set to a pressure within a range from 0.1 Torr to 30 Torr, preferably from 0.2 Torr to 20 Torr, and more preferably from 0.3 Torr to 13 Torr. For example, a supply flow rate of the NH3 gas may be set to a flow rate within a range from 0.1 slm to 10 slm, preferably from 0.2 slm to 2 slm. For example, the supply flow rate of the N2 gas may be set to a flow rate within a range from 0.1 slm to 20 slm. For example, a supply time of the NH3 gas may be set to a time within a range from 0.1 second to 60 seconds, preferably from 0.5 second to 5 seconds. For example, the temperature of the heater 10 may be set such that the temperature of the wafer 200 reaches and is maintained at a temperature within a range from 200° C. to 900° C., preferably from 300° C. to 850° C., and more preferably from 400° C. to 750° C.

The NH3 gas supplied to each of the wafers 200 reacts with at least a part of the first layer (that is, the silicon-containing layer) formed on each of the wafers 200 in the first step. Thereby, the first layer is thermally nitrided under a non-plasma atmosphere and changed (modified) into a second layer containing silicon (Si) and nitrogen (N), that is, a silicon nitride layer (also simply referred to as a "SiN layer").

After the second layer (SiN layer) is formed, the valve 52*b* is closed to stop a supply of the NH3 gas into the inner tube 21. Then, a substance such as the NH3 gas remaining in the process chamber 23 and reaction by-products is removed from the process chamber 23 in accordance with the same process sequences as those of the first step.

Performing Predetermined Number of Times

By performing the cycle wherein the first step and the second step described above are performed non-simultaneously (that is, performed alternately without overlapping with each other) the predetermined number of times (n times, n is an integer equal to or greater than 1), it is possible to form the SiN film of a predetermined thickness on each of the wafers 200. It is preferable that the cycle described above is performed a plurality of times. That is, it is preferable that the cycle is repeatedly performed the plurality of times until the SiN film of a desired thickness is obtained by controlling the second layer formed in each cycle to be thinner than the SiN film of the desired thickness and by stacking the second layer by repeatedly performing the cycle.

After-Purge Step and Returning to Atmospheric Pressure Step

After the film-forming step is completed and the SiN film of the predetermined thickness is formed, the N2 gas is supplied into the reaction tube 20 and exhausted through the exhaust pipe 61. As a result, the inner atmosphere of the process chamber 23 is purged, and a substance such as a residual gas in the process chamber 23 and reaction by-products in the process chamber 23 is removed from the process chamber 23 (after-purge step). Thereafter, the inner atmosphere of the process chamber 23 is replaced with the inert gas (substitution by the inert gas), and the inner pressure of the process chamber 23 is returned to the normal pressure (returning to atmospheric pressure step).

Boat Unloading Step and Wafer Discharging Step

Thereafter, the seal cap 50 is lowered by the boat elevator (not shown), and the lower end of the reaction tube 20 is opened. Then, the boat 40 with the processed wafers 200 supported therein is unloaded (transferred) out of the reaction tube 20 (boat unloading step). Then, the processed wafers 200 are discharged (transferred) from the boat 40 after the boat 40 is unloaded out of the reaction tube 20 (wafer discharging step).

(3) Configuration of Gas Guide R

Hereinafter, a configuration of the gas guide R capable of controlling the flow of the exhaust gas (that is, a flow path of the exhaust gas, specifically, a length of the flow path) in the annular space between the inner tube 21 and the outer tube 22 will be described. As described above, in the present specification, the annular space between the inner tube 21 and the outer tube 22 is also referred to as the "exhaust buffer space".

Figure 6A:
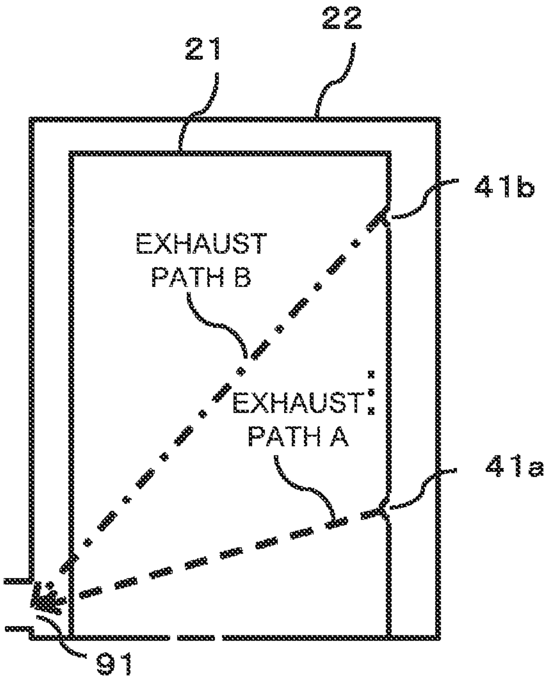
FIGS. 6A and 6B are diagrams schematically illustrating a flow of an exhaust gas discharged into an annular space between the inner tube 21 and an outer tube 22 through each of first exhaust ports 41*a* and 41*b* provided in the inner tube 21, and flowing toward a second exhaust port 91 provided in the outer tube 22.

FIG. 6A is a diagram schematically illustrating the flow path of the exhaust gas in the exhaust buffer space when the gas guide R is not provided in the exhaust buffer space. In FIG. 6A, "EXHAUST PATH A" schematically illustrates the flow path of the exhaust gas toward the second exhaust port 91 through the first exhaust port 41*a* (among the first exhaust ports 41) provided closest to the second exhaust port 91. Further, in FIG. 6A, "EXHAUST PATH B" schematically illustrates the flow path of the exhaust gas toward the second exhaust port 91 through the first exhaust port 41*b* (among the first exhaust ports 41) other than the first exhaust port 41*a*. As shown in FIG. 6A, when the gas guide R is not provided in the exhaust buffer space, a length of the exhaust path A is shorter than that of the exhaust path B.

According to the configuration shown in FIG. 6A, due to a difference between the lengths of the exhaust path A and the exhaust path B, a velocity of the exhaust gas flowing through the exhaust path A tends to be higher than the velocity of the exhaust gas flowing through the exhaust path B. Further, a velocity of a process gas such as the source gas and the reactive gas flowing in the horizontal direction from the gas supply port 31*a* toward the first exhaust port 41*a* tends to be higher than the velocity of the process gas flowing in the horizontal direction from the gas supply port 31*b* toward the first exhaust port 41*b*. As a result, an amount of the process gas supplied to a wafer (among the wafers 200) in a lower portion of the substrate accommodating region 65 tends to be greater than an amount of the process gas supplied to a wafer (among the wafers 200) in an upper portion of the substrate accommodating region 65. Therefore, a thickness of the SiN film formed on each of the wafers 200 may be non-uniform between the wafers 200. Specifically, the thickness of the SiN film formed on the wafer 200 in the lower portion of the substrate accommodating region 65 may be thicker than the thickness of the SiN film formed on the wafer 200 in the upper portion of the substrate accommodating region 65.

In order to address such a problem described above, according to the present embodiments, as shown in FIGS. 5A through 5C, the gas guide R (which collectively refers to a group of gas guide plates including a first fin 300, a plurality of second fins including a second fin 400, and a plurality of third fins including a third fin 500 described later) is provided in the exhaust buffer space so as to be capable of controlling the flow of the exhaust gas (that is, the flow path of the exhaust gas) in the exhaust buffer space. Hereinafter, the plurality of second fins including the second fin 400 may also be referred to as the "second fins 400", and the plurality of third fins including the third fin 500 may also be referred to as the "third fins 500".

As shown in FIGS. 5B, 5C and the like, the gas guide R includes the first fin 300 in the vicinity of the first exhaust port 41*a* in a space between the first exhaust port 41*a* and the second exhaust port 91. More specifically, the first fin 300 is provided directly below the first exhaust port 41*a* so as to face the outer tube 22 at which the second exhaust port 91 is provided. The first fin 300 is configured as a gas guide plate protruding from the outer wall of the inner tube 21 toward an inner wall of the outer tube 22, that is, protruding radially outward from the inner tube 21. The first fin 300 is configured such that a gap is provided by maintaining a predetermined distance (for example, a distance greater than 2 mm and less than 7 mm) between an end portion of the first fin 300 protruding radially outward from the inner tube 21 and the inner wall of the outer tube 22.

Further, as shown in FIG. 4, the first fin 300 is provided on the outer wall of the inner tube 21 in the vicinity of the first exhaust port 41*a* so as to extend in the horizontal direction along an outer periphery of the outer wall of the inner tube 21. More specifically, the first fin 300 is provided on the outer wall of the inner tube 21 along the outer periphery of the outer wall of the inner tube 21 and extends for a predetermined length (which is an extension length) greater than an inner diameter of the exhaust port A in the horizontal direction. For example, when viewed from above, the first fin 300 is configured such that an angle θ connecting a central axis 150 of the inner tube 21 and both end portions of the first fin 300 along the outer periphery of the outer wall of the inner tube 21 may set to a predetermined angle within a range from 20° to 180°.

Figure 6B:
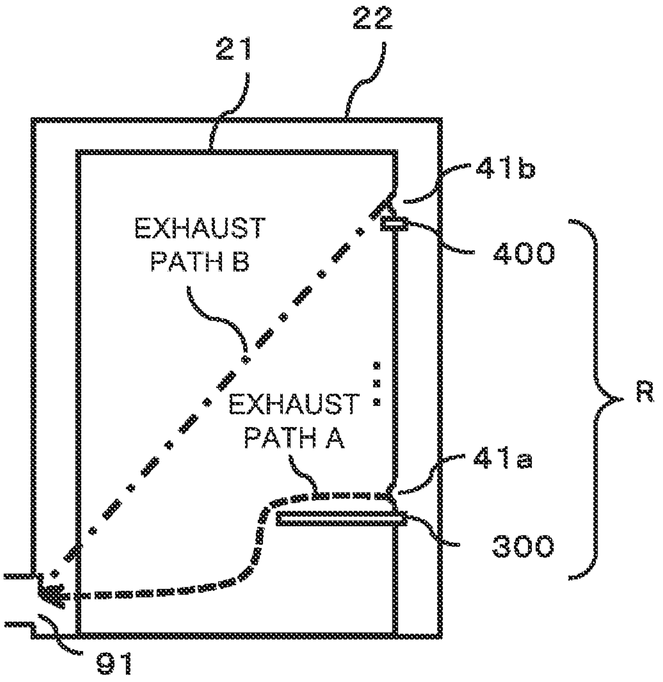

By providing the first fin 300 as described above, as shown in FIG. 6B, it is possible to redirect the exhaust gas discharged through the first exhaust port 41*a* to flow around the first fin 300 with a predetermined distance therebetween in the horizontal direction (that is, a circumferential direction of the inner tube 21). Thereby, by extending the length of the exhaust path A, it is possible to set (or adjust) the length of the exhaust path A to become close to the length of the exhaust path B. As a result, by appropriately reducing the velocity of the exhaust gas flowing through the exhaust path A, it is possible to set (or adjust) the velocity of the exhaust gas flowing through the exhaust path A to become close to the velocity of the exhaust gas flowing through the exhaust path B. Further, by appropriately reducing the velocity of the process gas flowing in the horizontal direction from the gas supply port 31*a* toward the first exhaust port 41*a*, it is possible to set (or adjust) the velocity of the process gas flowing in the horizontal direction from the gas supply port 31*a* toward the first exhaust port 41*a* to become close to the velocity of the process gas flowing in the horizontal direction from the gas supply port 31*b* toward the first exhaust port 41*b*. As a result, by appropriately reducing the amount of the process gas supplied to the wafer (among the wafers 200) in the lower portion of the substrate accommodating region 65, it is possible to set (or adjust) the amount of the process gas supplied to the wafer in the lower portion of the substrate accommodating region 65 to become close to the amount of the process gas supplied to the wafer (among the wafers 200) in the upper portion of the substrate accommodating region 65. Thereby, it is possible to set (or adjust) the thickness of the SiN film formed on each of the wafers 200 such that the thickness of the SiN film is uniformized between the wafers 200.

Further, the gas guide R according to the present embodiments further includes the second fin 400 (or the second fins 400) in addition to the first fin 300.

The second fin 400 is provided in the vicinity of the first exhaust ports 41 in a space between the first exhaust port 41*b* other than the first exhaust port 41*a* and the second exhaust port 91. More specifically, the second fin 400 is provided directly below the first exhaust port 41*b*. Similar to the first fin 300, the second fin 400 is configured as a gas guide plate protruding from the outer wall of the inner tube 21 toward the inner wall of the outer tube 22, that is, protruding radially outward from the inner tube 21. Similar to the first fin 300, the second fin 400 is configured such that a gap is provided by maintaining a predetermined distance (for example, a distance greater than 2 mm and less than 7 mm) between an end portion of the second fin 400 protruding radially outward from the inner tube 21 and the inner wall of the outer tube 22.

Further, similar to the first fin 300, the second fin 400 is provided on the outer wall of the inner tube 21 in the vicinity of the first exhaust port 41*b* so as to extend in the horizontal direction along the outer periphery of the outer wall of the inner tube 21. More specifically, the second fin 400 is provided on the outer wall of the inner tube 21 along the outer periphery of the outer wall of the inner tube 21 and extends for a predetermined length (which is an extension length) greater than an inner diameter of the first exhaust port 41*b* in the horizontal direction. The extension length of the second fin 400 is set to be shorter than the extension length of the first fin 300 (see FIGS. 5C and 6B).

Further, the second fins 400 are provided corresponding to the first exhaust ports (among the first exhaust ports 41) other than the first exhaust port 41*a*, that is, corresponding to the first exhaust ports 41*b*, respectively. An extension length of each of the second fins 400 is set to be gradually shorter as a distance from the second exhaust port 91 increases, that is, as a height of a location of each of the second fins 400 increases.

By providing the second fin 400 (or the second fins 400) as described above, it is possible to redirect the exhaust gas discharged through each of the first exhaust ports 41*b* to flow around the second fin 400 with predetermined distances therebetween in the horizontal direction (that is, the circumferential direction of the inner tube 21). Further, it is possible to set (or adjust) each of detour distances of the exhaust gas discharged through each of the first exhaust ports 41*b* to become gradually shorter as a location of each of the first exhaust ports 41*b* becomes distanced away from the second exhaust port 91. Thereby, it is possible to set (or adjust) a length of each exhaust path of the exhaust gas toward the second exhaust port 91 from the first exhaust ports 41 such that the length of each exhaust path is uniformized between the first exhaust ports 41. Further, it is possible to set (or adjust) the velocity of the process gas flowing in the horizontal direction from the gas supply ports 31 toward the first exhaust ports 41 such that the velocity of the process gas is uniformized between the gas supply ports 31, that is, between the wafers 200. As a result, it is possible to set (or adjust) the thickness of the SiN film formed on each of the wafers 200 such that the thickness of the SiN film is further uniformized between the wafers 200.

Figure 7A:
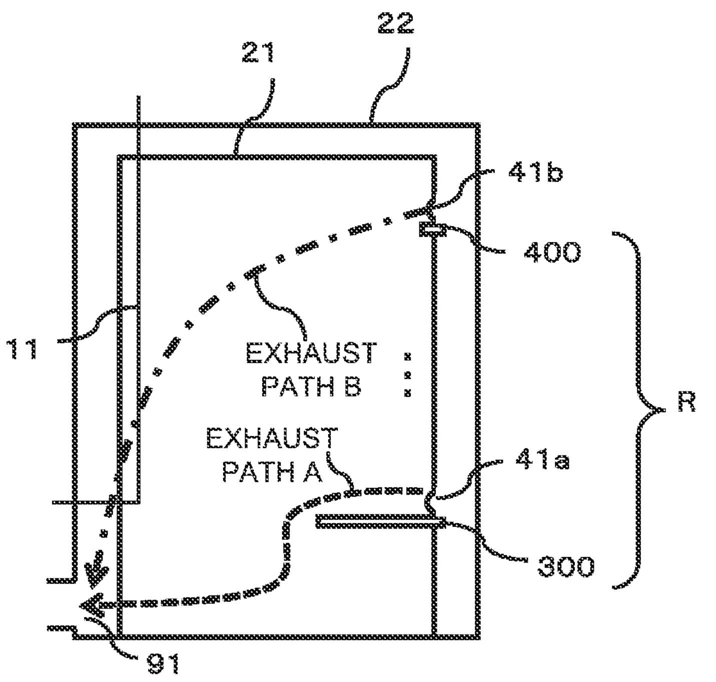
FIGS. 7A and 7B are diagrams schematically illustrating the flow of the exhaust gas discharged into the annular space between the inner tube 21 and the outer tube 22 through each of the first exhaust ports 41*a* and 41*b* provided in the inner tube 21, and flowing toward the second exhaust port 91 provided in the outer tube 22.

Further, even when the first fin 300 and the second fin 400 (or the second fins 400) are provided in the exhaust buffer space, as shown in FIG. 7A, a path of the exhaust path B may be changed depending on conditions and the like. Even in such a case, although the effects described above can be sufficiently obtained, the velocity of the exhaust gas discharged through the first exhaust ports 41 may be slightly non-uniform between one another within a range where the effects described above can be obtained. Thereby, a thickness uniformity of the film between the wafers 200 (that is, a thickness uniformity of the SiN film formed on each of the wafers 200) may be affected.

Therefore, the gas guide R according to the present embodiments further includes the third fin 500 (or the third fins 500) in addition to the first fin 300 and the second fin 400 (or the second fins 400) in order to obtain the effects described above more stably.

Similar to the first fin 300 and the second fin 400, the third fin 500 is configured as a gas guide plate protruding from the outer wall of the inner tube 21 toward the inner wall of the outer tube 22, that is, protruding radially outward from the inner tube 21. Similar to the first fin 300 and the second fin 400, the third fin 500 is configured such that a gap is provided by maintaining a predetermined distance (for example, a distance greater than 2 mm and less than 7 mm) between an end portion of the third fin 500 protruding radially outward from the inner tube 21 and the inner wall of the outer tube 22.

Figure 7B:
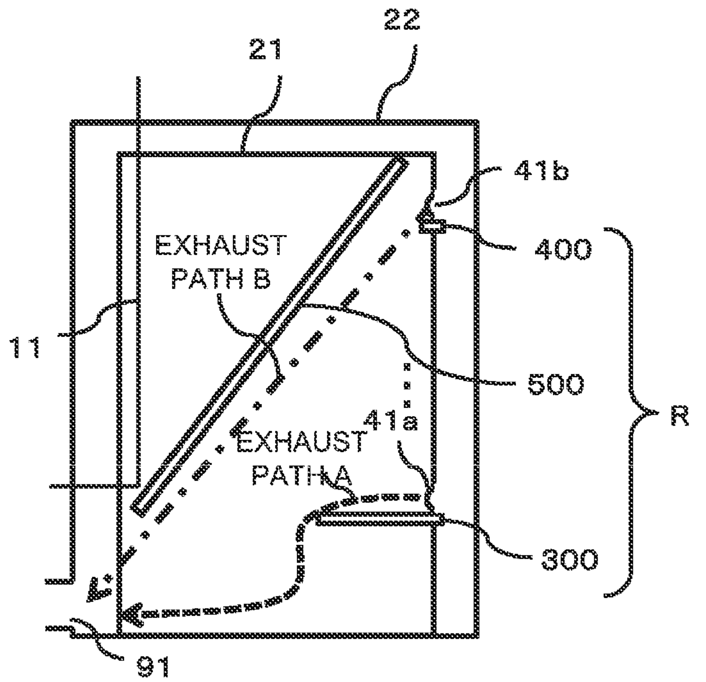

As shown in FIG. 7B, the third fin 500 is provided so as to extend in a direction (that is, a direction whose vertical component is non-zero) different from the direction along an outer periphery of the side wall of the inner tube 21 (that is, the direction in which the first fin 300 or the second fin 400 extends, or the horizontal direction). More specifically, each of the third fins 500 is of a linear shape (flat plate shape), and is provided so as to be inclined at a predetermined angle with respect to the vertical direction such that each of the third fins 500 gradually approaches the gas supply ports 31 as it goes downward in the vertical direction. End portions (that is, an upper end portion and a lower end portion) of the third fin 500 extend to such positions as to collide with the gas flowing in the horizontal direction at the end portions of the first fin 300 and the second fin 400.

Further, as shown in FIGS. 5A through 5C, the third fins 500 are provided along the circumferential direction of the inner tube 21, that is, provided in each of two flow paths from the first exhaust ports 41 to the second exhaust port 91. Further, as shown in FIG. 5B, the third fins 500 are provided at positions spaced apart by a predetermined distance from both ends of the first fin 300 and both ends of the second fin 400 extending in the horizontal direction such that the third fins 500 are spaced apart by a predetermined distance from both ends described above along the outer periphery of the side wall (that is, the outer periphery of the outer wall) of the inner tube 21. A distance D1 between the end portion of the first fin 300 and the third fin 500 along the outer periphery of the side wall of the inner tube 21 is set to be greater than a distance D2 between the first fin 300 and the second fin 400 adjacent to the first fin 300 along the arrangement direction described above (for example, the vertical direction according to the present embodiments). For example, the distance D1 may be twice the distance D2. The lower end portion of each of the third fins 500 is provided above a lower end portion of the heater 10.

By providing the third fin 500 (or the third fins 500) as described above, it is possible to quickly change the flow path of the exhaust gas toward the second exhaust port 91 after the exhaust gas discharged through the first exhaust port 41*b* is redirected to flow around the second fin 400 (or the second fins 400) with a predetermined distance therebetween in the horizontal direction. Thereby, it is possible to reliably set (or adjust) the length of each exhaust path of the exhaust gas toward the second exhaust port 91 from the first exhaust ports 41 such that the length of each exhaust path is uniformized between one another. Further, by setting the distance between the third fin 500 and the first fin 300 or between the third fin 500 and the second fin 400 as described above, it is possible for the gas to flow toward the second exhaust port 91 without being stagnated even when the gas discharged from above is concentrated around the first fin 300. Further, by providing the third fin 500, the exhaust gas does not contact the temperature sensor 11 provided along the outer wall of the inner tube 21. Thereby, it is possible to accurately detect the temperature.

(4) Effects According to Present Embodiments

According to the present embodiments described above, it is possible to obtain at least one among the following effects.

(a) According to the present embodiments, since the first fin 300 is provided in the vicinity of the first exhaust port 41*a* between the first exhaust port 41*a* and the second exhaust port 91, it is possible to redirect the exhaust gas discharged through the first exhaust port 41*a* to flow around the first fin 300 with the predetermined distance therebetween in the circumferential direction of the inner tube 21 (that is, the horizontal direction). Thereby, by extending the length of the exhaust path A, it is possible to set (or adjust) the length of the exhaust path A to become close to the length of the exhaust path B. According to the present embodiments, by appropriately reducing the velocity of the process gas flowing in the horizontal direction from the gas supply port 31*a* toward the first exhaust port 41*a*, it is possible to set (or adjust) the velocity of the process gas flowing in the horizontal direction from the gas supply port 31*a* toward the first exhaust port 41*a* to become close to the velocity of the process gas flowing in the horizontal direction from the gas supply port 31*b* toward the first exhaust port 41*b*. As a result, it is possible to uniformize the amount of the process gas supplied to each of the wafers 200 in the substrate accommodating region 65, and it is also possible to set (or adjust) the thickness of the SiN film formed on each of the wafers 200 such that the thickness of the SiN film is uniformized between the wafers 200.

(b) According to the present embodiments, the first fin 300 is provided along the outer periphery of the side wall of the inner tube 21 and extends for the predetermined length (which is the extension length) greater than the inner diameter of the first exhaust port 41*a* in the horizontal direction. Thereby, it is possible to reliably redirect the exhaust gas discharged through the first exhaust port 41*a* to flow around the first fin 300 with the predetermined distance therebetween in the circumferential direction of the inner tube 21 (that is, the horizontal direction). As a result, it is also possible to set (or adjust) the thickness of the SiN film formed on each of the wafers 200 such that the thickness of the SiN film is uniformized between the wafers 200.

(c) According to the present embodiments, the second fin 400 is further provided in the vicinity of the first exhaust ports 41*b* in the space between the exhaust port B (that is, the first exhaust port 41*b*) and the second exhaust port 91. Further, the second fin 400 is provided along the outer periphery of the side wall of the inner tube 21 and extends for the predetermined length (which is the extension length) greater than the inner diameter of the first exhaust port 41*b* in the horizontal direction. Thereby, it is possible to redirect the exhaust gas discharged through each of the first exhaust ports 41*b* to flow around the second fin 400 with the predetermined distances therebetween in the horizontal direction (that is, the circumferential direction). According to the present embodiments, it is possible to adjust not only the length of the exhaust path A but also the length of the exhaust path B. Therefore, it is possible to uniformize the length of the exhaust path A and the length of the exhaust path B more reliably. As a result, it is also possible to set (or adjust) the thickness of the SiN film formed on each of the wafers 200 such that the thickness of the SiN film is uniformized between the wafers 200 more reliably.

(d) According to the present embodiments, the second fins 400 are further provided along the arrangement direction described above (for example, the vertical direction according to the present embodiments). The length of each of the second fins 400 is set to be gradually shorter as the distance from the second exhaust port 91 increases. Thereby, it is possible to more reliably set (or adjust) the length of the exhaust path B independently for each of the first exhaust ports 41*b* such that the length of each exhaust path B is uniformized therebetween. According to the present embodiments, it is possible to set (or adjust) the velocity of the process gas flowing in the horizontal direction from the gas supply ports 31 toward the first exhaust ports 41 such that the velocity of the process gas is uniformized between the gas supply ports 31, that is, between the wafers 200. As a result, it is possible to set (or adjust) the thickness of the SiN film formed on each of the wafers 200 such that the thickness of the SiN film is further reliably uniformized between the wafers 200.

(e) According to the present embodiments, the third fin 500 is further provided. The third fin 500 is provided so as to extend in the direction different from the direction along the outer periphery of the side wall of the inner tube 21. Further, the end portions of the third fin 500 extend to such positions as to collide with the process gas flowing in the horizontal direction at the end portions of the first fin 300 and the second fin 400. Thereby, it is possible to quickly change the flow path of the exhaust gas toward the second exhaust port 91 after the exhaust gas discharged through each of the first exhaust ports 41 (that is, the first exhaust port 41*a* and the first exhaust ports 41*b*) is redirected to flow around the first fin 300 or the second fin 400 (or the second fins 400) with the predetermined distance therebetween in the horizontal direction. According to the present embodiments, it is possible to stabilize the length of the exhaust path A and the length of each exhaust path B. Further, Thereby, it is possible to more reliably uniformize the length of the exhaust path A and the length of each exhaust path B. As a result, it is possible to set (or adjust) the thickness of the SiN film formed on each of the wafers 200 such that the thickness of the SiN film is further reliably uniformized between the wafers 200.

(f) According to the present embodiments, the third fins 500 are provided at the positions spaced apart by the predetermined distance from both ends of the first fin 300 and both ends of the second fin 400 such that the third fins 500 are spaced apart by the predetermined distance from both ends described above along the outer periphery of the side wall of the inner tube 21. More specifically, the distance D1 between the end portion of the first fin 300 and the third fin 500 along the outer periphery of the side wall of the inner tube 21 is set to be greater than the distance D2 between the first fin 300 and the second fin 400 adjacent to the first fin 300 along the arrangement direction described above (for example, the vertical direction according to the present embodiments). By appropriately securing the gap between the plurality of fins as described above, it is possible to avoid a local stagnation of the exhaust gas from being stagnated in the exhaust buffer space (for example, a concentration of the exhaust gas in a space between the first fin 300 and the third fin 500 and the stagnation of the exhaust gas due to the concentration of the exhaust gas). As a result, it is possible to perform a uniform pressure adjustment over the entire region of the process chamber 23, and it is possible to set (or adjust) the thickness of the SiN film formed on each of the wafers 200 such that the thickness of the SiN film is further reliably uniformized between the wafers 200.

(g) According to the present embodiments, by providing the third fin 500, it is difficult for the exhaust gas to contact the temperature sensor 11 provided along the outer wall of the inner tube 21. Thereby, it is possible to accurately detect the temperature over the entire region of the substrate accommodating region 65. As a result, it is possible to improve a quality of the substrate processing.

Other Embodiments of Present Disclosure

While the technique of the present disclosure is described in detail by way of the embodiments described above, the technique of the present disclosure is not limited thereto. The technique of the present disclosure may be modified in various ways without departing from the scope thereof.

For example, while the embodiments described above are described by way of an example in which the second fin 400 (or the second fins 400) and the third fin 500 (or the third fins 500) are provided in the exhaust buffer space in addition to the first fin 300, the technique of the present disclosure is not limited thereto. For example, one of the second fin 400 and the third fin 500 or both of the second fin 400 and the third fin 500 may not be provided in the exhaust buffer space (that is, may be omitted). Even in such a case, it is also possible to obtain at least a part of the effects described based on the embodiments described above.

For example, while the embodiments described above are described by way of an example in which the first fin 300, the second fin 400 (or the second fins 400) and the third fin 500 (or the third fins 500) are provided on the outer wall of the inner tube 21, the technique of the present disclosure is not limited thereto. For example, at least one among the first fin 300, the second fin 400 or the third fin 500 may be provided on the inner wall of the outer tube 22, or the first fin 300, the second fin 400 and the third fin 500 may be provided on the inner wall of the outer tube 22. Even in such a case, it is also possible to obtain the effects described based on the embodiments described above.

For example, while the embodiments described above are described by way of an example in which the second fins 400 are provided corresponding to the first exhaust ports 41*b*, respectively, the technique of the present disclosure is not limited thereto. For example, the second fins 400 may be provided corresponding to some of the first exhaust ports 41*b* (for example, at intervals of 2 first exhaust ports to 5 first exhaust ports). Even in such a case, it is also possible to obtain the effects described based on the embodiments described above.

For example, while the embodiments described above are described by way of an example in which the third fin 500 is provided so as to be inclined with respect to the arrangement direction (that is, the vertical direction), the technique of the present disclosure is not limited thereto. For example, the third fin 500 is provided so as to be parallel with respect to the arrangement direction (that is, the vertical direction). Further, a shape of the third fin 500 is not limited to the linear shape, and may be a curved shape. Even in such a case, it is also possible to obtain the effects described based on the embodiments described above.

For example, while the embodiments described above are described by way of an example in which the first exhaust ports 41 are provided on the side wall of the inner tube 21 at the positions facing the gas supply ports 31 via the substrate accommodating region 65, the technique of the present disclosure is not limited thereto. For example, the first exhaust ports 41 may be provided to be spaced apart by a predetermined distance from the positions on the side wall of the inner tube 21 facing the gas supply ports 31 via the substrate accommodating region 65 along the circumferential direction of the side wall of the inner tube 21. Even in such a case, it is also possible to obtain the effects described based on the embodiments described above.

For example, while the embodiments described above are described by way of an example in which the gas supply ports 31 and the first exhaust ports 41 are provided corresponding to the wafers 200 accommodated in the substrate accommodating region 65, respectively, the technique of the present disclosure is not limited thereto. For example, at least one among the gas supply ports 31 or the first exhaust ports 41, or both of the gas supply ports 31 and the first exhaust ports 41 may be provided corresponding to some of the wafers 200 (for example, at intervals of 2 wafers to 5 wafers). Even in such a case, it is also possible to obtain the effects described based on the embodiments described above.

For example, while the embodiments described above are described by way of an example in which the SiN film is formed on the wafer 200, the technique of the present disclosure is not limited thereto. For example, the technique of the present disclosure may be preferably applied to form a film such as a silicon film (Si film), a silicon oxide film (SiO film) and a silicon oxynitride film (SiON film) on the wafer 200. Further, the technique of the present disclosure may be preferably applied to form a metal-based film such as a titanium film (Ti film), a titanium oxide film (TiO film), a titanium nitride film (TiN film), an aluminum film (Al film), an aluminum oxide film (AlO film) and a hafnium oxide film (HfO) on the wafer 200. Even in such a case, it is also possible to obtain the effects described based on the embodiments described above.

The technique of the present disclosure is not limited to a process of forming a film on each of the wafers 200. For example, the technique of the present disclosure may be preferably applied when a process such as an etching process, an annealing process and a plasma modification process is performed on each of the wafers 200. Even in such a case, it is also possible to obtain the effects described based on the embodiments described above.

According to some embodiments of the present disclosure, it is possible to improve the processing uniformity between the plurality of substrates when processing the plurality of substrates.

What is claimed is:

1. A substrate processing apparatus comprising:

an inner tube provided with a substrate accommodating region in which a plurality of substrates are accommodated in a multistage manner along a predetermined arrangement direction while the plurality of substrates are horizontally oriented;

an outer tube provided outside the inner tube;

a plurality of gas supply ports provided on a side wall of the inner tube along the predetermined arrangement direction;

a plurality of first exhaust ports provided on the side wall of the inner tube along the predetermined arrangement direction;

a second exhaust port provided at a lower end portion of the outer tube; and a gas guide configured to be capable of controlling a flow of a gas in an annular space between the inner tube and the outer tube, wherein the gas guide comprises a first fin in vicinity of a lowermost first exhaust port among the plurality of first exhaust ports that is closest to the second exhaust port in a space between the lowermost first exhaust port and the second exhaust port, and one or more second fins in vicinity of one or more upper first exhaust ports among the plurality of first exhaust ports other than the lowermost first exhaust port in a space between the second exhaust port and the one or more upper first exhaust ports, and the one or more second fins are provided along an outer periphery of the side wall of the inner tube and extend for predetermined lengths greater than an inner diameter of each of the one or more upper first exhaust ports where the inner diameter is measured in a horizontal direction, and the predetermined lengths of the one or more second fins are set to be shorter than a predetermined length of the first fin.

2. The substrate processing apparatus of claim 1, wherein the first fin is provided along the outer periphery of the side wall of the inner tube and extends for the predetermined length greater than an inner diameter of the lowermost first exhaust port where the inner diameter is measured in a horizontal direction.

3. The substrate processing apparatus of claim 1, wherein the one or more second fins are provided along the predetermined arrangement direction.

4. The substrate processing apparatus of claim 3, wherein the predetermined lengths of the one or more second fins are set to be gradually shorter as a distance of each of the one or more second fins from the second exhaust port increases.

5. The substrate processing apparatus of claim 1, wherein the one or more second fins are provided corresponding to the one or more upper first exhaust ports, respectively.

6. The substrate processing apparatus of claim 1, wherein the gas guide further comprises one or more third fins extending in a direction different from a direction along the outer periphery of the side wall of the inner tube.

7. The substrate processing apparatus of claim 6, wherein the one or more third fins are configured in a manner that each end portion thereof extends to such position as to collide with the gas flowing in the horizontal direction, and that the gas flowing in the horizontal direction at an end portion of the first fin is guided by the one or more third fins toward the second exhaust port.

8. The substrate processing apparatus of claim 6, wherein a distance D1 along the outer periphery of the side wall of the inner tube between an end portion of the first fin and each of the one or more third fins is set to be greater than a distance D2 along the predetermined arrangement direction between the first fin and a closest second fin among the one or more second fins located adjacent to the first fin.

9. The substrate processing apparatus of claim 6, wherein the one or more third fins are provided at positions spaced apart by a predetermined distance from two opposing side ends of the first fin along the outer periphery of the side wall of the inner tube.

10. The substrate processing apparatus of claim 1, wherein the plurality of first exhaust ports are provided on the side wall of the inner tube at positions facing the plurality of gas supply ports via the substrate accommodating region.

11. The substrate processing apparatus of claim 1, wherein the plurality of first exhaust ports are provided corresponding to the plurality of substrates accommodated in the substrate accommodating region, respectively.

12. An inner tube provided inside an outer tube and provided with a substrate accommodating region in which a plurality of substrates are accommodated in a multistage manner along a predetermined arrangement direction while the plurality of substrates are horizontally oriented, wherein a second exhaust port is provided at a lower end portion of the outer tube, wherein a plurality of gas supply ports are provided on a side wall of the inner tube along the predetermined arrangement direction, wherein a plurality of first exhaust ports provided on the side wall of the inner tube along the predetermined arrangement direction, wherein a first fin constituting at least a part of a gas guide configured to be capable of controlling a flow of a gas in an annular space between the inner tube and the outer tube, the first fin being provided in vicinity of a lowermost first exhaust port among the plurality of first exhaust ports that is closest to the second exhaust port in a space between the lowermost first exhaust port and the second exhaust port, and one or more second fins in vicinity of one or more upper first exhaust ports among the plurality of first exhaust ports other than the lowermost first exhaust port in a space between the second exhaust port and the one or more upper first exhaust ports, and the one or more second fins are provided along an outer periphery of the side wall of the inner tube and extend for predetermined lengths greater than an inner diameter of each of the one or more upper first exhaust ports where the inner diameter is measured in a horizontal direction, and the predetermined lengths of the one or more second fins are set to be shorter than a predetermined length of the first fin.

13. A method of manufacturing a semiconductor device, comprising:

(a) accommodating a plurality of substrates in a multistage manner along a predetermined arrangement direction in a substrate accommodating region in an inner tube while the plurality of substrates are horizontally oriented;

(b) supplying a gas into the inner tube through a plurality of gas supply ports provided on a side wall of the inner tube along the predetermined arrangement direction;

(c) discharging the gas supplied into the inner tube toward an outer tube provided outside the inner tube through a plurality of first exhaust ports provided on the side wall of the inner tube along the predetermined arrangement direction;

(d) exhausting the gas in an annular space between the inner tube and the outer tube through a second exhaust port provided at a lower end portion of the outer tube; and (e) controlling a flow of the gas in the annular space between the inner tube and the outer tube by using a gas guide comprising a first fin in vicinity of a lowermost first exhaust port among the plurality of first exhaust ports that is closest to the second exhaust port in a space between the lowermost first exhaust port and the second exhaust port, and one or more second fins in vicinity of one or more upper first exhaust ports among the plurality of first exhaust ports other than the lowermost first exhaust port in a space between the second exhaust port and the one or more upper first exhaust ports, and the one or more second fins are provided along an outer periphery of the side wall of the inner tube and extend for predetermined lengths greater than an inner diameter of each of the one or more upper first exhaust ports where the inner diameter is measured in a horizontal direction, and the predetermined lengths of the one or more second fins are set to be shorter than a predetermined length of the first fin.

* * * * *